US006684377B2

(12) United States Patent
Barney et al.

(10) Patent No.: US 6,684,377 B2
(45) Date of Patent: Jan. 27, 2004

(54) ACCESS CELL DESIGN AND A METHOD FOR ENABLING AUTOMATIC INSERTION OF ACCESS CELLS INTO AN INTEGRATED CIRCUIT DESIGN

(75) Inventors: Clive Alva Barney, Fort Collins, CO (US); Scott Ryan Grange, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 355 days.

(21) Appl. No.: 09/779,301

(22) Filed: Feb. 7, 2001

(65) Prior Publication Data

US 2002/0108095 A1 Aug. 8, 2002

(51) Int. Cl.[7] ................................................. G06G 9/45
(52) U.S. Cl. ............................. 716/10; 716/12; 716/14; 716/17
(58) Field of Search ............................. 716/10, 12, 14, 716/17

(56) References Cited

U.S. PATENT DOCUMENTS

| 4,240,094 A | | 12/1980 | Mader | |
|---|---|---|---|---|
| 5,557,533 A | * | 9/1996 | Koford et al. | 716/9 |
| 5,612,893 A | * | 3/1997 | Hao et al. | 716/2 |
| 5,618,744 A | * | 4/1997 | Suzuki et al. | 438/599 |

FOREIGN PATENT DOCUMENTS

EP 0210397 2/1987

* cited by examiner

Primary Examiner—George Eckert
Assistant Examiner—Chris C Chu

(57) ABSTRACT

An access cell for routing current from a first cell to a second cell includes a first current path coupled to a second current path via a third current path. The third current path includes a set of three legs configured in a manner such that a first of the three legs may be severed in half to interrupt current flow between the first current path and the second current path, leaving the other two legs of the third current path intact. Either half of the first leg includes a connection point at which a spare cell may be coupled to the access cell to enable current flow between the spare cell and either the first cell or the second cell. A method for inserting access cells into an integrated circuit includes modifying a cell library so that a library description of a standard access cell is temporarily defined as having two terminals, modifying a netlist so that a set of nets listed therein are represented as two different nets, and modifying the netlist to include a set of access cells each of which is defined as being connected, at each terminal, to one of the two different nets. The modified netlist and modified cell library may then be used by a place and route tool to automatically create a layout of the integrated circuit having access cells inserted therein. After the layout has been created, the modified netlist is again modified so that the two virtual nets are once again represented in the netlist as a single net and the layout is modified so that the two virtual nets are represented in the layout as a single net.

26 Claims, 7 Drawing Sheets

ACCESS CELL DESIGN AND A METHOD FOR ENABLING AUTOMATIC INSERTION OF ACCESS CELLS INTO AN INTEGRATED CIRCUIT DESIGN

The present invention generally relates to integrated circuits, and more particularly, to a design for an access cell and a method for enabling automatic insertion of access cells into an integrated circuit design.

The process of designing an integrated circuit may involve inserting a set of access cells into the integrated circuit design to enable reconfiguration of the integrated circuit in the event that post fabrication testing reveals a design flaw in the circuit. More particularly, the design process results in a layout that represents the physical structure of the integrated circuit and that layout is used to fabricate a limited number of the integrated circuit for testing purposes. The test circuits are typically subjected to a battery of tests related to both the functionality of the circuit and the physical characteristics of the circuit. If, during testing, the circuit does not operate as desired, then a logic circuit associated with the integrated circuit is examined to identify one or more cells responsible for the undesired operation.

As will be understood by one having ordinary skill in the art, integrated circuits are designed to perform a set of functions that are implemented using a variety of structures referred to as cells. Included among these cells are logic cells that are designed to perform any of a set of logical operations such as AND, OR, NOR, etc., and the cells are coupled together to form the logic circuit which causes the integrated circuit to perform the desired set of functions. In many instances, undesired operation detected during testing may be corrected by using access cells to reconfigure the logic circuit and remove the logic cell(s) responsible for the undesired operation and/or to add one or more spare logic cells to the logic circuit. Thus, in addition to logic cells, the integrated circuit also includes a set of access cells that facilitate the removal of one or more logic cells from the logic circuit and/or the addition of one or more spare logic cells to the logic circuit. The spare logic cells, which are disposed at various locations throughout the integrated circuit, are referred to as "spare" cells because, although each is capable of performing a desired logical operation, these spare logic cells are not coupled to the logic circuit and, as a result, do not affect circuit operation.

To facilitate reconfiguration of the logic circuit, each access cell provides a path through which current may be routed from a first logic cell to a second logic cell. The configuration of the current path may be physically altered to cause the current flowing through the path to be rerouted so that instead of flowing from the first logic cell to the second logic cell, the current flows from the first logic cell to a spare logic cell. In this manner, the access cell may be used to insert the spare logic cell into the logic circuit and remove, for example, the second logic cell from the logic circuit. Alternatively, the current may be redirected to flow from the spare logic to the second logic cell thereby removing the first logic cell from the circuit.

Unfortunately, the methods that are currently available for inserting access cells into an integrated circuit design are costly, time consuming, and/or unreliable. In particular, a first method for access cell insertion is performed manually. Using this method, after the layout of the integrated circuit has been created, the locations at which the access cells will be inserted into the design are determined manually by a design engineer. The design engineer uses the layout to identify desired positions at which the access cells may be inserted in the integrated circuit design. Often parts of the layout will have to be spread out in order to create a hole large enough for the access cell. All of the positions that are deemed suitable are then incorporated manually into the layout design. Although this manual insertion method is effective, it is time consuming, tedious and costly in terms of engineering hours. In addition, the design process is iterative so that a layout may be revised many times, each time resulting in a differently configured layout, thereby requiring that the locations at which the access cells be inserted be determined over again. Moreover, as with most industries, integrated circuit design processes are becoming increasingly more automated. As a result, manual design processes are generally less favored.

A second method of access cell insertion is performed using a "place and route" tool. As will be understood by one having ordinary skill in the art, a place and route tool is a software tool used to create a layout for an integrated circuit design. Before the place and route tool is used, a set of access cells are added to a netlist. As will be understood by one having ordinary skill in the art, the netlist is a listing of the logic cells required to implement the functionality of the integrated circuit and the netlist also provides the connectivity between the listed cells. The access cells added to the netlist are each described in the netlist as being single terminal cells. As will be understood by one having ordinary skill in the art, a single terminal cell is connected to a single net, or wire. However, place and route tools often cause single terminal cells to be inserted in a manner such that the access cell is coupled to only a single logic cell. As a result, current does not completely route through the access cell, i.e., into and out of the access cell, but is instead only routed into the access cell. Thus, the designer cannot use the access cell to reconfigure the circuit in the manner described above, e.g., from a first cell to a spare cell instead of from a first cell to a second cell, thereby defeating the purpose of inserting the access cell into the circuit. Methods have been used to increase the likelihood that complete route through is achieved by using statistics to identify locations in the circuit at which access cell placement is more likely to result in complete route through. However, these statistical methods do not guarantee complete route through and often result in suboptimal placement of access cells in the layout.

Alternatively, the access cells have been described in the netlist as two terminal cells. Describing the access cells as two terminal cells in the netlist ensures that the place and route tool inserts the access cell in a manner that guarantees complete route through. Thus, the access cell is shown as being connected to a first net at a first terminal and a second net at a second terminal in the resulting layout. However, because the access cell does not perform any logical operation on the current routed therethrough, the access cell is not actually connected to two different nets but will instead actually be connected to a single net that has been severed in half. Specifically, the access cell is actually connected at the first terminal to a first half of the net and at the second terminal to the second half of the net. Thus, a single net is represented in the resulting layout as two different nets, but is still represented in the netlist as a single net. However, in order to effectively test and debug the design of the integrated circuit, the resulting layout and the netlist must coincide or else errors are generated thereby hindering the testing and debugging process.

Moreover, access cells present challenges to integrated circuit designers beyond those associated with inserting the cells. Specifically, there is an on-going effort to further miniaturize integrated circuits. As a result, space on an integrated circuit must be optimized thereby causing designers, where possible, to use cells having the smallest permissible dimensions. For example, the smallest permissible dimensions of an access cell are dictated, at least in part, by the precision of a focused ion beam used to sever the pathway routed through the access cell. More particularly, the access cell must be at least a minimum size to ensure that there is sufficient room between the access cell and neighboring cells so that the neighboring cells are not inadvertently damaged or destroyed when the FIB is used to sever the pathway to enable current reconfiguration. Thus, ideally, access cells having the minimum permissible size are selected for insertion into the integrated circuit. However, access cells must also comply with a set of spacing requirements that specify minimum distances between various features of the access cell. Unfortunately, access cells having typical pathway configurations must often be larger than the minimum permissible size so that these spacing requirements are met. Further, in order to provide a space large enough to fit the access cell, the overall size of the integrated circuit must often be increased.

Thus, there is a need in the art for a method for enabling automatic insertion of access cells into an integrated circuit design that ensures that the access cells are 1) inserted in a manner such that they are usable for their intended purpose, i.e., so that complete route through is achieved, and 2) inserted in a manner that does not adversely affect testing of the integrated circuit. In addition, there is a further need in the art for an access cell having a pathway configuration that satisfies the minimum spacing requirements associated with the access cell without adversely impacting the overall dimensions of the access cell.

SUMMARY OF THE INVENTION

The present invention is directed to an access cell design and a method for enabling automatic insertion of access cells into an integrated circuit design that ensures each access cell is coupled between two or more logic cells. The access cell includes a wire that is configured to include two current paths that are coupled by a third current path. The three current paths form a current pathway by which current may be routed through the access cell from a first cell to a second cell. Further, the third current path includes three legs that are configured in a manner such that the minimum spacing requirements associated with the integrated circuit are met without requiring that the size of the access cell be increased.

The method for inserting access cells involves modifying a library description of the access cell to indicate that the access cell is a two-terminal cell instead of a single terminal cell and modifying a netlist associated with the integrated circuit to incorporate a set of access cells and to specify a set of nets, or wires, to which the access cells are to be coupled. As will be understood by one having ordinary skill in the art, the netlist is a listing of the logic cells required to implement the functionality of the integrated circuit and the netlist also provides the connectivity between the listed cells. Further, "net" is a term of art used to refer generally to the wires disposed in the integrated circuit. Specifically, each net to which an access cell will be coupled is divided into a set of two virtual nets by modifying a data field in the netlist and each access cell is defined as being coupled between the two virtual nets. The modified netlist is supplied to a place and route tool which uses the netlist and the modified library description of the access cell to create a layout of the integrated circuit in which all two-terminal cells are coupled between two logic cells, thereby ensuring that each access cell is coupled between two logic cells. After the layout is obtained, the netlist is again modified by renaming all virtual nets to their originally assigned names and the layout is modified so that all references to the virtual nets instead refer to the original nets.

DETAILED DESCRIPTION

Figure 1:
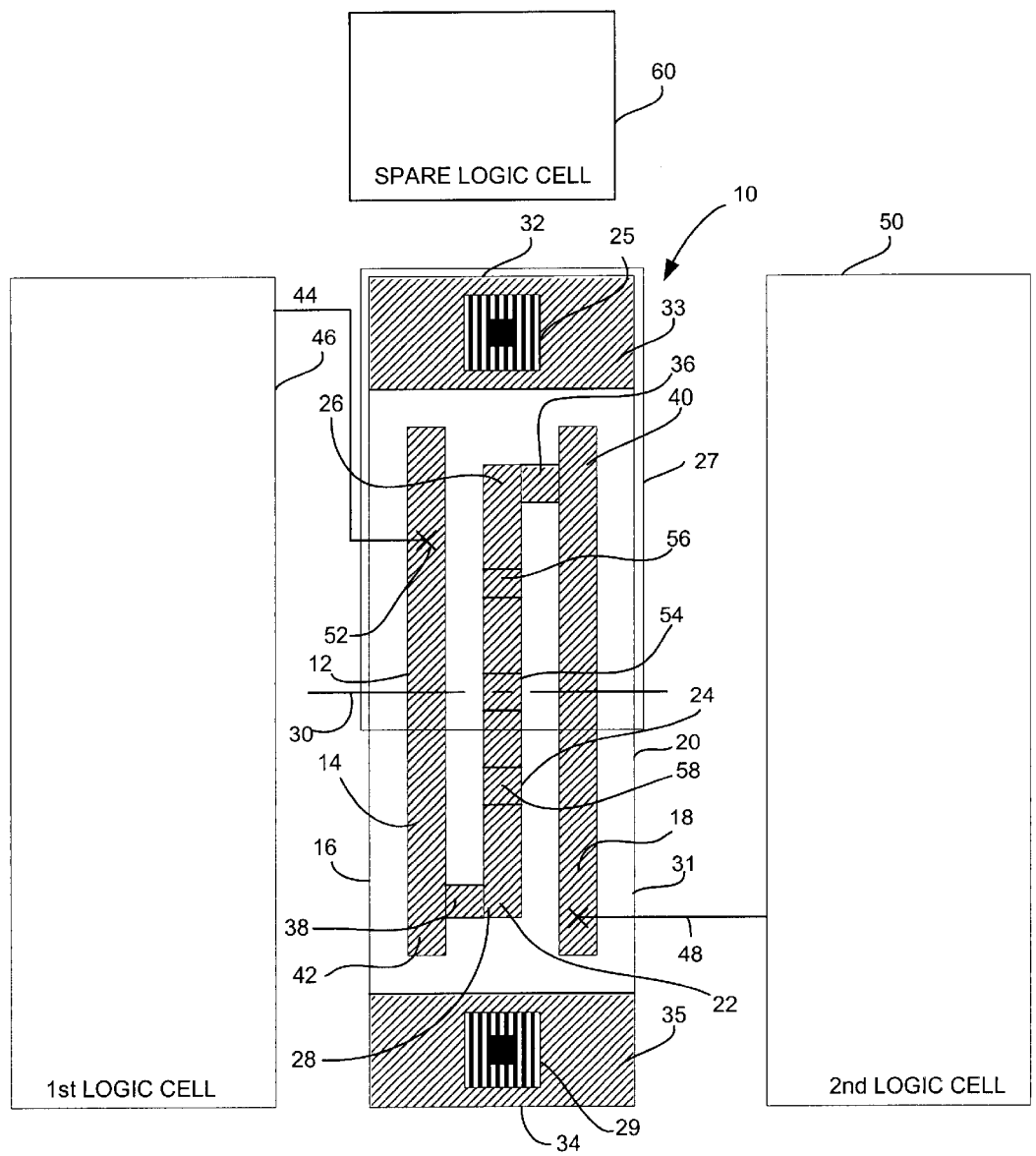
FIG. 1 is a schematic of an access cell coupled to a first logic cell and a second logic cell.

Referring now to FIG. 1, an access cell 10 includes a current pathway 12 implemented with a wire that is preferably although not necessarily disposed in any of a set of metal layers (not shown) formed in an integrated circuit. As will be understood by one having ordinary skill in the art, integrated circuits typically include a set of metal layers used for forming a set of current pathways by which current is routed through the integrated circuit. To prevent timing problems that may occur, for example, when a large current is routed through an access cell having a wire with a large resistance, the wire may be disposed in a metal layer having a suitable resistance. Alternatively, if convenient to dispose the wire in a layer having a large resistance, steps to lessen the resistance of the wire may be taken. For example, in an effort to fit all of the necessary components into the limited space of the integrated circuit, designers typically select wires having widths that are as small as allowable by a set of design rules associated with the integrated circuit. As will be understood by one having ordinary skill in the art, the design rules specify various physical parameters necessary for the proper construction of the integrated circuit such as, for example, the minimum allowable distance between wires or conducting paths disposed in the integrated circuit and the minimum allowable width of such wires. However, wire resistance is inversely related to wire width such that the wire resistance increases as the wire width decreases. Thus, to lessen the resistance of an access cell wire disposed in a metal layer having a large resistance, the designer may forego the option to conserve space and instead select an access cell wire having a larger than minimum width to thereby lessen the resistance of the wire disposed in the access cell.

The current pathway 12 is configured to include a first current path 14 that is generally parallel to a first side 16 of the access cell 10 and a second current path 18 that is generally parallel to a second side 20 of the access cell 10. A third current path 22 is disposed between and connects the first current path 14 to the second current path 18. The third current path 22 includes a first leg 24 that is generally parallel to the first and second current paths 14, 18, and further includes an upper end 26 and a lower end 28, each lying above and below, respectively, a center-line 30 that is located approximately midway between a third side 32 of the cell 10 and a fourth side 34 of the cell 10. The third current path 22 further includes a second leg 36 and a third leg 38. The second leg 36 is generally perpendicular to the first and second current paths 14, 18 and connects the upper end 26 of the first leg 24 to an upper end 40 of the second current path 18. The third leg 38 is generally perpendicular to the first and second current paths 14, 18 and connects the lower end 28 of the third leg 38 to a lower end 42 of the first current path 14. A well tap 25 may be disposed in a well region 27 of the access cell 10 and a substrate tap 29 may be disposed in a substrate region 31 of the access cell 10. In addition, a power rail 33 is disposed along the third side 32 of the access cell and a ground rail 35 is disposed along the fourth side 34 of the access cell 10. One having ordinary skill in the art will understand that tap cells provide a means by which the well region of the integrated circuit is coupled to a biasing voltage source and by which the substrate region is coupled to ground. The tap cells must be inserted in the circuit at locations such that the distance between any single tap cell and the nearest tap cell does not exceed a minimum allowable distance thereby to prevent latch-up, a well-known phenomenon wherein a positive feedback circuit generates excess current that may damage the circuit.

A first wire 44 connected to the first current path 14 couples a first logic cell 46 to the access cell 10 and a second wire 48 connected to the second current path 18 couples a second logic cell 50 to the access cell 10. Thus, current flows from the first logic cell 46 into the first current path 14, through the third current path 22, and then into the second current path 18. After flowing through the second current path 18, the current flows to the second logic cell 50. Although the first wire 44 is shown as being connected to the first current path 14 at a specific location 52, the first wire 44 may instead be connected to the first current path 14 at any location residing on the first current path 14. Likewise, the second wire 48 coupled to the second current path 18 may be disposed at any location residing on the second current path 18. Thus, the length of the first and second current paths 14, 18, i.e., the manner in which the current paths extend nearly the entire length of the access cell, provides enhanced routing flexibility by increasing the number of port locations at which the wire may be connected. In an alternative embodiment, the first and second current paths may be foreshortened.

The access cell 10 further includes a cut point 54 at which the third current path 22 may be physically cut to prevent current flow from the first logic cell 46 to the second logic cell 50. In addition, a set of upper and lower connect points 56, 58 disposed on the third current path 22 provide locations at which a spare logic cell 60 may be connected to the third current path 22 thereby to reconfigure the current pathway 12. The configuration of the current pathway 12, and, more particularly, the shape of the third current path 22 and the position of the third current path 22 relative to the first and second current paths 14, 18 ensure that a set of spacing rules associated with the integrated circuit are met without adversely impacting the overall dimensions of the access cell.

As will be understood by one having ordinary skill in the art, the spacing rules are typically specified in the design rules and specify the minimum allowable distance between the cut and connect points and other features of the integrated circuit including, for example, metal regions, diffusion regions and poly regions. In addition, the design rules may further specify the minimum permissible size of an access cell. Specifically, the first leg 24 of the third current path 22 is parallel to the sides 16 and 20 of the access cell 10, i.e., is disposed lengthwise across the access cell, and, as a result, the first leg 24 may span nearly the entire length of the access cell, if desired. Moreover, access cells are typically long enough to ensure that cut and connect points disposed in a current path that extends lengthwise through the access cell can be spaced a sufficient distance from one another to meet the spacing requirements between cut and connect points. Thus, by positioning the first leg 24 in a lengthwise manner, the spacing requirements associated with the cut and connect points are met without also requiring that the overall dimensions of the access cell be increased beyond a minimum permissible size. In contrast, access cells having cut and connect points disposed on a current path that extends laterally through the access cell must often have a width that is larger than a minimum permissible width in order to meet the minimum spacing requirements between cut and connect points. In addition, the length of the second and third legs 36, 38 of the third current path 22 is designed to be large enough so that offsetting the third current path from the first and second current paths by a distance equal to the length of the second and third legs ensures that the spacing requirements are met. As will further be understood by one having ordinary skill in the art, although referred to as points, the cut and connect points 54, 56, 58 do not each occupy a single point on the current pathway 22 but actually span a predefined area, wherein the distances between the boundaries of the predefined areas are required to satisfy the spacing rules.

Figure 2:
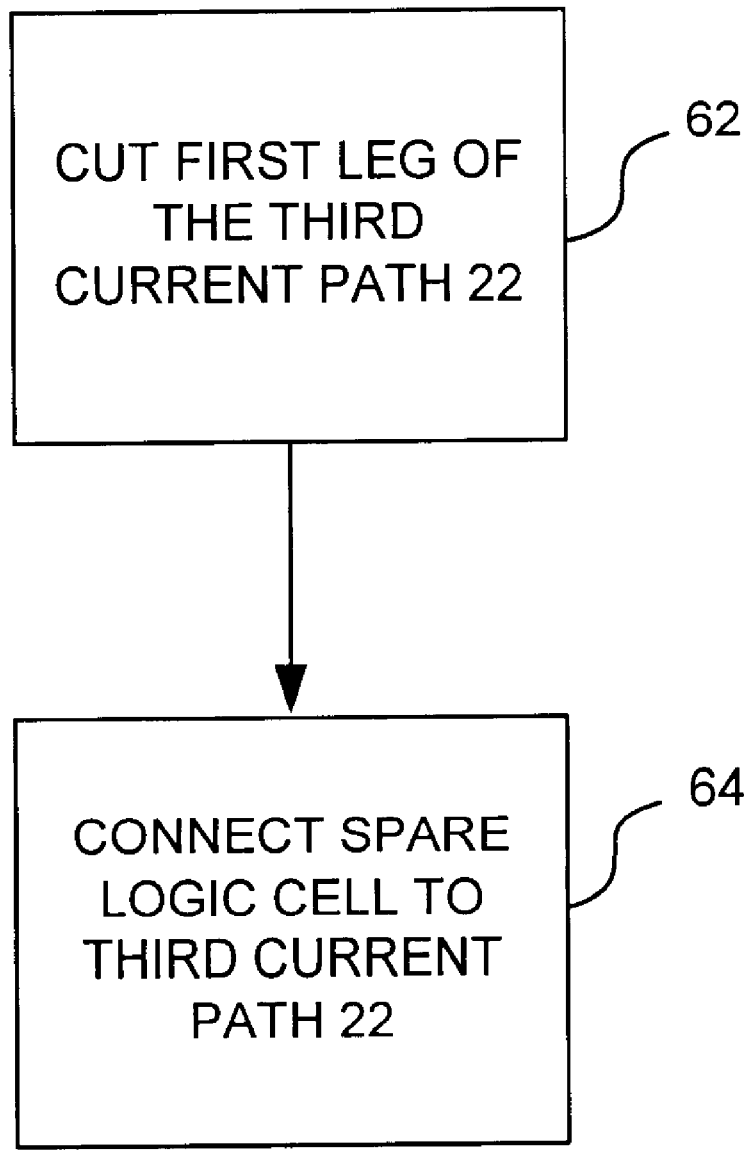
FIG. 2 is a flowchart that illustrates a method for reconfiguring a logic circuit by altering a current pathway of the access cell of FIG. 1.

Referring now to FIG. 2, a method for reconfiguring the logical flow of an integrated circuit begins at a first step 62 at which the designer or engineer physically cuts the first leg 24 of the third current path 22 at the cut point 54. By cutting the first leg 24 of the third current path 22, current flow from the first current path 14 to the second current path 18 is prohibited. Thus, assuming that the access cell 10 was originally connected between the first logic cell 46 the second logic cell 50 as shown in FIG. 1, current flow between the first and second logic cells 44, 50 is disabled when the step 62 is performed. Next, at a step 64, current flow is enabled between the spare logic cell 60 and either the first or second logic cell 46, 50 by using a wire to couple the spare logic cell 60 to either the lower or upper connect points 58, 56, respectively, of the third current path 22.

Figure 3:
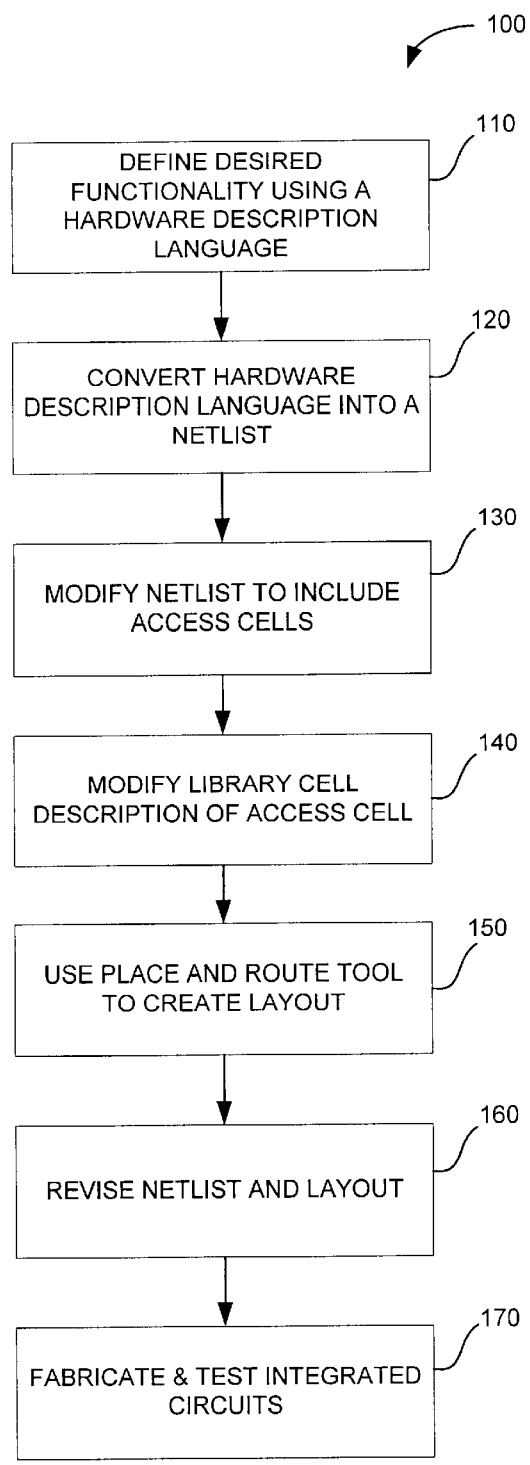
FIG. 3 is a flowchart illustrating a method for enabling automatic insertion of access cells.

Referring now to FIG. 3, a flowchart 100 illustrating a method for enabling automatic access cell insertion begins at a step 110 where the desired functionality of the integrated circuit is defined and described using a hardware description language such as, for example, Verilog or VHDL. As will be understood by one having ordinary skill in the art, the desired functionality will depend on how the integrated circuit is to be used. For example, if the integrated circuit is going to be used as a microprocessor, then the desired functionality of the microprocessor is defined. If, instead the integrated circuit is going to be used as an application specific integrated circuit (ASIC) then the desired functionality of the ASIC is defined.

The method then continues at a step 120 at which the hardware description language is converted into a netlist using any of a number of synthesis tools such as, for example, Design Compiler by Synopsys® or Build Gates by Cadence®. The netlist is a listing of the logic cells required to implement the functionality of the integrated circuit as described in the hardware description language. The logic cells listed in the netlist are selected by the synthesis tool during creation of the netlist from a standard cell library. As will be understood by one having ordinary skill in the art, a standard cell library includes information regarding each of a set of standard cells and further provides a physical description of each standard cell. For example, a standard cell library may include the physical size of the cell, the number of input/output terminals associated with the cell and the capacitance associated with each cell terminal. Thus, before designing an integrated circuit, a designer will select a standard cell library from which cells will be selected for the integrated circuit design. Of course, there are applications that may require one or more specialized cells in which case the designer will either create a custom cell for the netlist or alter a library cell in a manner required by the desired design. In addition to including a list of cells, the netlist provides the connectivity between the listed cells. For example, each cell is represented in the netlist by a set of data fields that provide information about the cell including, for example, a first data field for storing the name of a first net to which a first terminal of the cell is connected and a second data field for storing the name of a second net to which a second terminal of the cell is connected. Of course, additional fields are provided for cells having multiple input terminals and/or multiple output terminals. Also, at the step 120, the netlist version of the integrated circuit design may be used to perform computer simulations to test the integrated circuit design for defects.

Figure 4:
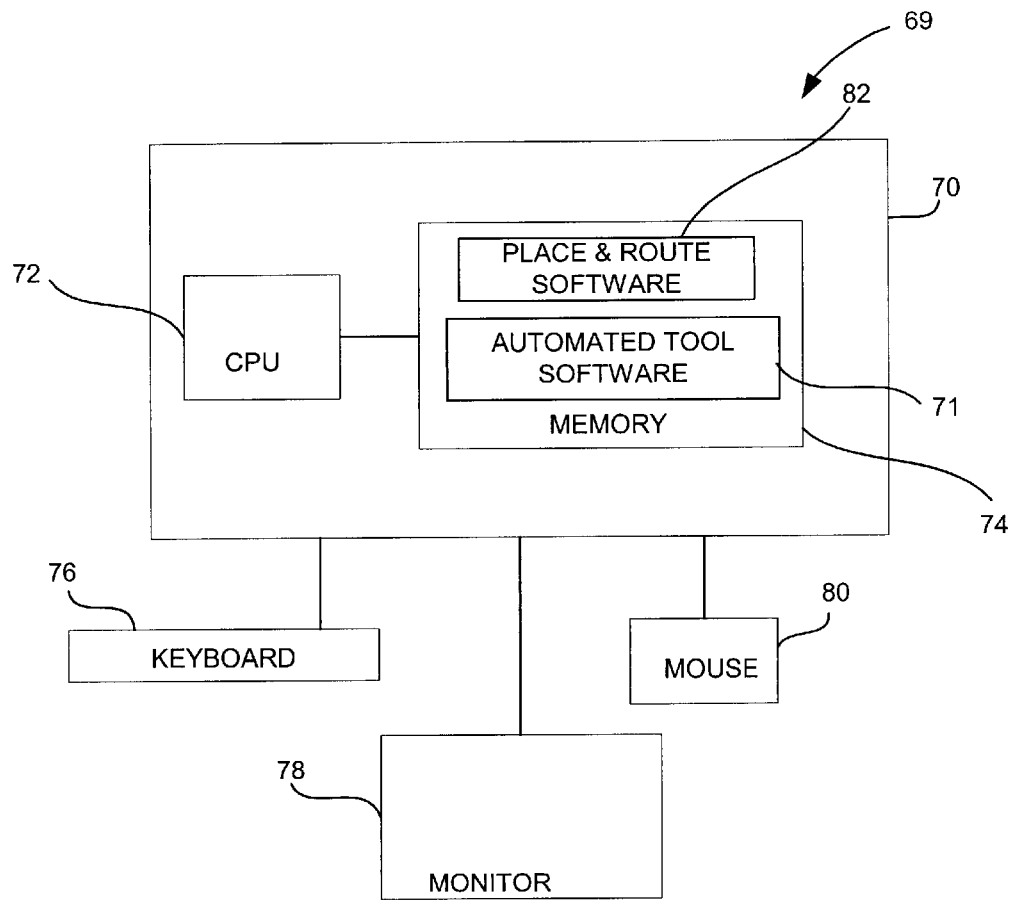
FIG. 4 is a block diagram of an automated tool configured to perform a method for modifying a netlist; and, FIGS. 5A–5C is a flow chart that illustrates a method for modifying a netlist.

Referring also to FIG. 4, next at step 130, the netlist is modified to include access cells according to a method that may be implemented using, for example, an automated tool 69. The automated tool may be implemented using a computer 70 programmed to execute a software code 71. The computer 70 includes a central processing unit (CPU) 72 coupled to a memory device 74 within which the software code 71 may be stored and may further include a keyboard 76, monitor 78 and mouse 80 by which a user may communicate with the CPU 72. Preferably, though not necessarily, a software package used to implement the place and route tool 82 may be stored in the memory 74 and executed by the computer 70 such that the netlist modified using the computer 70 and subsequently stored in the memory 74 may be accessed by the computer when executing the place and route software 82. If not configured in this manner, then the netlist after being modified would, of course, have to be removed from the memory 74 and supplied to the computer that is programmed to execute the place and route software. Alternatively, the automated tool 69 may be implemented using hardware alone or a combination of hardware and software. Specifically, and referring also to FIG. 5A, the method for modifying the netlist begins at a step 500 at which a user is prompted to identify and enter specific nets to which an access cell shall be coupled. For example, the designer may choose to identify nets that are associated with logic cells that implement a functionality that is known to be at risk for design flaws. The entered information may be stored in any file format using any unique filename such as, for example, LIST1.

Next, at a step 510, the user is prompted to identify nets to which access cells shall not be coupled and/or to enter a set of constraints such that access cells meeting the constraints shall not be coupled to an access cell. For example, the designer may wish to ensure that the access cells are not coupled to the output terminal of a driving cell, in which case the designer will constrain the nets to which access cells shall be coupled to only those nets that are not coupled to the output terminal of a driving cell. Alternatively, the designer may want to ensure that the access cells are not coupled to a particular type of net including, for example, clock and test nets which have special features to enable testing and will thus constrain the nets to which the access cells shall be coupled to only those nets that are not clock or test nets. The access cells entered at the step 510 may be saved in any convenient file format using any unique filename such as, for example, LIST2. Likewise, the constraints may be saved in any convenient file format using a unique file name, such as CONSTRAINTS. At a step 520, the user is prompted to select and enter a percentage of nets to which access cells shall be randomly coupled. As will be described further below, the selected percentage of nets will be used later in the method to randomly identify a set of nets to which access cells shall be coupled.

At a step 530, a variable used for counting, denoted "N," is set equal to zero. The counter is then incremented, at a step 540, by setting N=N+1. Next, at a step 550, the Nth net in the netlist is identified and, at a step 560, is compared to the contents of LIST1 to determine whether the Nth net is contained in the LIST1. If the Nth net is contained in LIST1, then the Nth net has been identified by the user as a net to which an access cell shall be coupled. As a result, control continues at a step 600 (see FIG. 5C) and a set of steps subsequent thereto wherein the netlist is modified to include an access cell coupled to the Nth net, as will be described further hereinafter. If instead the Nth net is not contained in LIST1, then the Nth net has not been specifically identified by the user as a net to which access cells shall be coupled and control proceeds from the step 560 to a step 570. Referring also to FIG. 5B which aligns with FIG. 5A at connecting points A and B, at the step 570, the Nth net is compared to the contents of LIST2. If the Nth net is contained in LIST2 then the user has identified the Nth net as a net to which an access cell shall not be coupled and control returns to the step 540.

If instead the Nth net is not contained in LIST2, then control continues at the step 580, at which the Nth net is compared to the constraints saved in the CONSTRAINTS file. If the Nth net is subject to any of the constraints, then the Nth net has been indirectly identified as one of the nets to which an access cell shall not be coupled. Thus, the Nth net shall not be coupled to an access cell and control returns to the block 540 and blocks subsequent thereto, as described above, so that the next net in the netlist may be examined.

If instead the Nth net does not satisfy any of the constraints identified by the user, then control continues at a step 590 at which a random selection algorithm is employed to determine whether the Nth net shall be selected at random for coupling to an access cell. Specifically, the random selection algorithm may employ a percentage technique by which a percentage of the nets listed in the netlist are selected for access cell insertion. Assuming, for example, that the user specified a percentage of 10% at the step 520, then the automated tool 69 uses a random number generator to generate a list of randomly selected nets that includes at least 10% of the total number of nets disposed in the integrated circuit. As will be understood by one having ordinary skill in the art, random number generators are well known in the art and are typically implemented using software that causes a computer to execute any of a number of random number generating algorithms. The random number generator may be included within the software 71 used to implement the automated tool 69. Alternatively, the random number generator may instead be implemented using a separate software package that generates random numbers and causes the random numbers to be stored in the memory 74, in which case the automated tool 69 will include software that causes the automated tool 69 to retrieve the randomly generated list of nets from the memory 74. Regardless of which implementation is used, the automated tool 69 then compares the Nth net to the list of randomly selected nets. If the Nth net is not listed among the randomly selected nets, then control returns to the block 540 and blocks subsequent thereto where the next net in the netlist is examined to determine whether an access cell shall be coupled to thereto. If instead at the step 590, the Nth net is listed among the randomly selected nets, then control proceeds to a block 600. Likewise, as described above, if at the step 560 (see FIG. 5A), the automated tool 69 determines that the Nth net is listed in LIST1 then the net has been identified as a net to which an access cell shall be coupled and control also proceeds to the step 600.

Figure 5A:
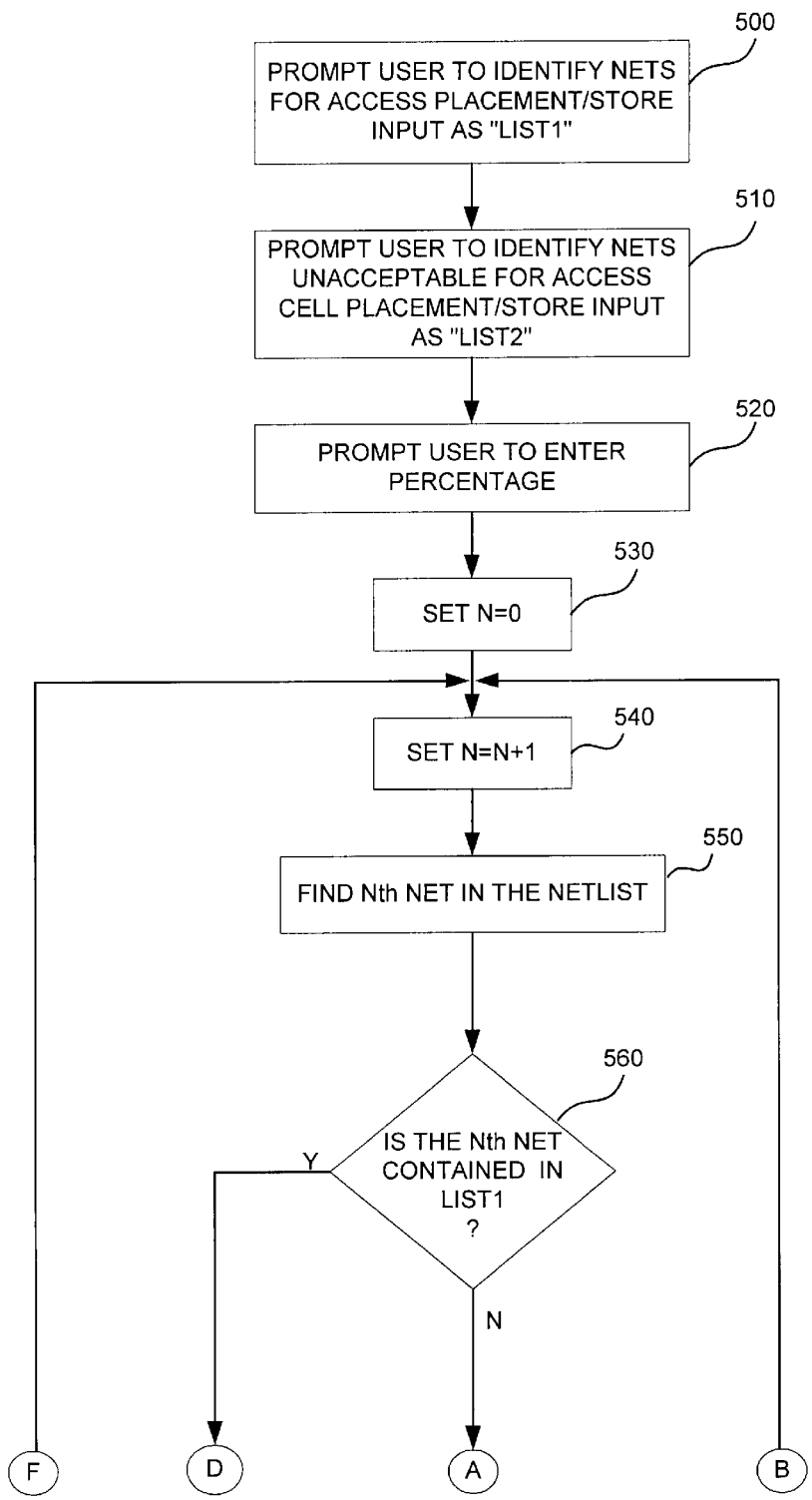
Figure 5B:
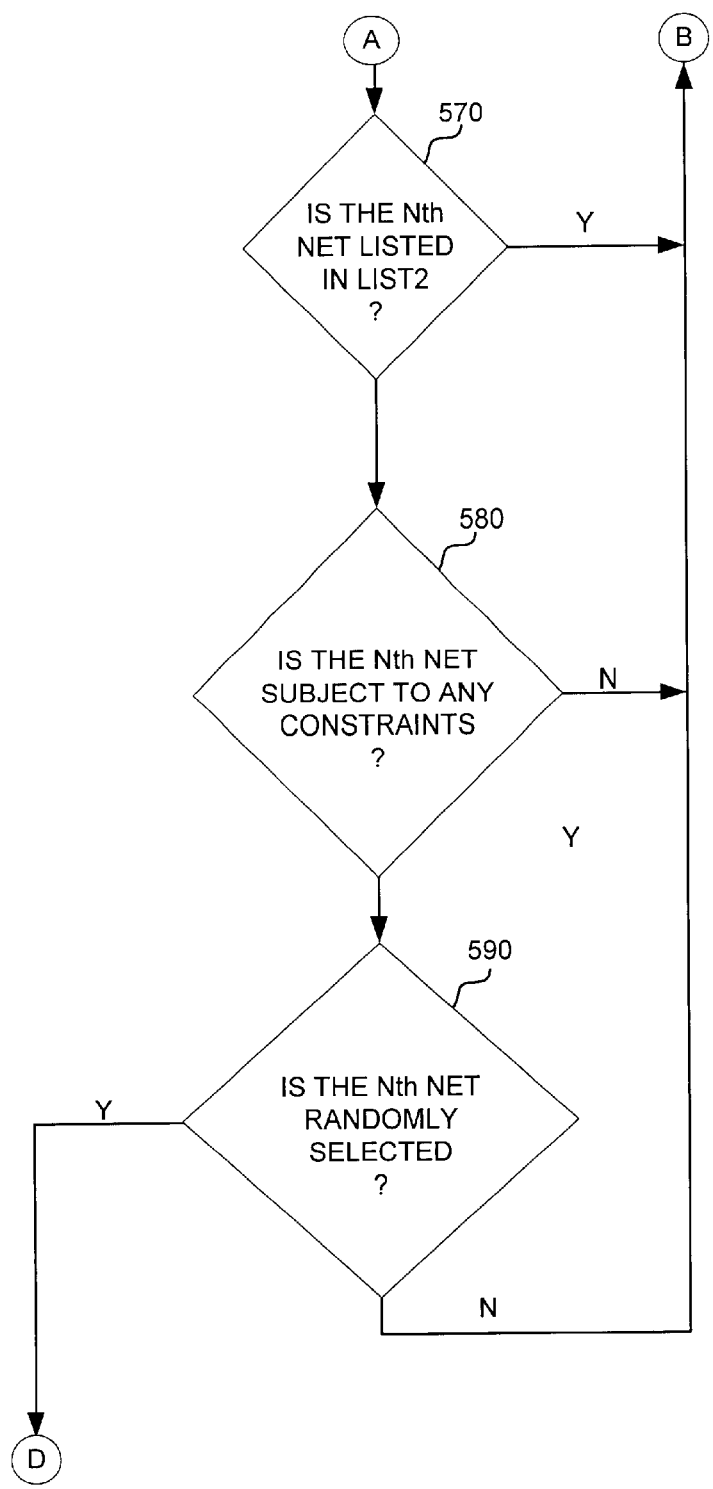
Figure 5C:
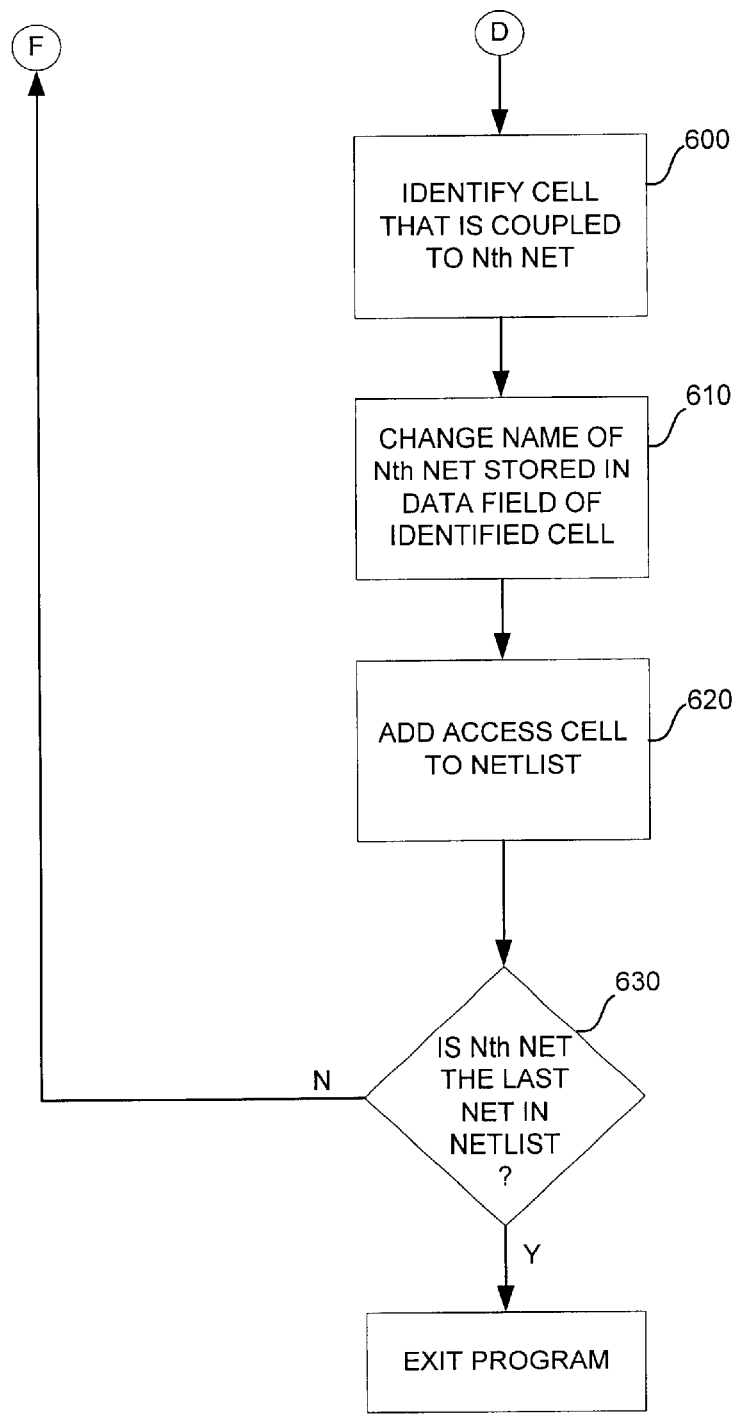

Referring also to FIG. 5C which aligns with FIG. 5A at connecting points D and F and with FIG. 5B at connecting point D, at the step 600, the automated tool 69 uses the netlist to identify a cell that is coupled to the selected net by examining the contents of the data fields associated with each cell represented in the netlist. Referring also to FIG. 1, assuming that the selected net couples a first logic cell to a second logic cell, then the netlist includes an entry for the first logic cell and the entry for the first logic cell includes a first or second data field having the name of the Nth net stored therein. Further, the netlist includes an entry for the second logic cell and the entry for the second logic cell includes a first or second data field having the name of the Nth net stored therein.

Next, at a step 610, the automated tool 69 modifies the data field associated with the cell identified at the step 600 so that instead of containing the name of the Nth net, the data field contains a unique name, i.e., a name that has not been used for any of the nets associated with the integrated circuit. Thus, the Nth net is virtually divided into two separate nets; a first virtual net bearing the name assigned to the original net and a second virtual net bearing the newly assigned unique name selected at the step 610. Control then continues at a step 620 at which a new entry, that is identified as an access cell corresponding to a standard access cell from the standard cell library, is added to the netlist. The name of the first virtual net is stored in the first data field for the access cell and the name of the second virtual net is stored in the second data field for the access cell. As will be appreciated by one having ordinary skill in the art, modifying the cells in this manner causes the connectivity of the net to be redefined in the netlist such that the first logic cell is defined as being coupled to the access cell, via the first virtual net and the second logic cell is defined as being coupled to the access cell via the second virtual net. Finally, the method for modifying the netlist ends at a step 630 where the automated tool 69 determines whether the Nth net is the last net in the netlist. If the Nth net is indeed the last net in the netlist, then the portion of the method performed by the automated tool 69 is concluded and the method continues at a step 140 (see FIG. 3). If the Nth net is not the last net in the netlist, then control returns to the block 540 and the blocks subsequent thereto as described above.

After the netlist has been modified at the step 130, the method continues at a step 140 where data associated with the description of an access cell in the standard cell library is modified. Specifically, at the step 140, the physical data associated with the access cell stored in the cell library of choice is modified to indicate that the access cell includes two terminals instead of only a single terminal.

As will be understood by one having ordinary skill in the art, access cells are typically defined in cell libraries as single terminal devices. Specifically, using conventional automated insertion methods, access cells are inserted, using a place and route tool, by adding access cells into the netlist and by specifying a single net to which the access cell shall be coupled. One having ordinary skill in the art will further recognize that cell libraries may be provided in any of a number of library exchange formats and, as a result, the steps necessary to modify the physical data associated with the access cell will depend on the format of the cell library being modified. Because the steps necessary to modify the cell libraries are dependent on the format of the library being modified and because cell libraries and methods for modifying cell libraries are well known in the art, the steps necessary to implement step 140 are not discussed further herein.

Referring again to FIG. 3, after the cell library has been modified, the method continues at a step 150 where a floor plan and the modified version of the netlist are provided as data input to a computer-automated design tool referred to as a "place and route" tool such as, Silicon Ensemble by Cadence®. The "place and route" tool uses the netlist and the floor plan to design a layout for the integrated circuit, and as described above, is a software package 82 that may be stored in the memory 74 and executed by the CPU 72. As further described above, the layout is a representation of the integrated circuit that includes the physical dimensions and configuration of the integrated circuit components and serves as a blueprint from which the integrated circuit may be manufactured. As will be understood by one having ordinary skill in the art, the floor plan defines the physical constraints of the integrated circuit, including, for example, the location of a power grid, the location of input/output ports, the dimensions of the integrated circuit block and the areas of the integrated circuit in which wires associated with the power grid and other pre-existing circuitry are disposed.

The place and route tool is programmed to use the netlist and the floor plan to determine the positions at which each logic cell will be located in the integrated circuit and to determine the routing of the wires used to interconnect the cells. In addition, the place and route tool inserts each of the access cells added to the netlist by the automated tool 69 and are configured in relation to the integrated circuit components according to the manner in which the access cells are defined in the modified netlist. As will be appreciated by one having ordinary skill in the art, the place and route tool creates the layout by obtaining physical information about the cells listed in the netlist from the standard cell library. Thus, the descriptions of the access cells are modified at the step 140 to indicate that the cells have two terminals instead of only a single terminal to ensure that the information regarding the access cells in the library coincides with the information regarding the access cells supplied in the netlist. Specifically, because the modified netlist indicates that the access cells have two different terminals, with each being connected to a different net, the library description of the access cell must also indicate that the access cell has two terminals. If instead the library description of the access cell is not modified at the step 140, the description of the access cell provided in the netlist will not match the information provided in the cell library, possibly resulting in access cells that are not properly routed or possibly preventing the place and route tool from creating a layout. Thus, modifying the library description for an access cell and modifying the netlist enables the automatic insertion of the access cells by the place and route tool.

After the creation of the layout at the preceding step, the method continues at a step 160 at which the netlist is again revised and at which the layout is modified. Specifically, the data field in which the name of the second virtual net is stored is revised to store the name of the first virtual net, which is identical to the name of the original net. In addition, the layout is revised so that all references to the second virtual net appearing in the layout, instead refer to the name of the original net. Thus, the first and second virtual nets are again represented in the netlist as a single net and are also represented in the layout as a single net. As will be understood by one having ordinary skill in the art, this re-naming step is necessary to facilitate future testing, trouble shooting, and fabrication of the integrated circuit. More particularly, after the integrated circuit layout is created, it may be used to fabricate and test a set of integrated circuits at a step 170. During this testing, the circuit design, as represented in the design documentation, including the netlist, a schematic(s) created using the netlist, and the layout must be consistent, or synchronized, so that a set of automated tools may be used to test the design. In addition, various simulations may be performed to test the circuit design and to characterize performance characteristics associated with the integrated circuit. However, the simulation tools used to perform these simulations will not operate properly unless the design documentation is consistent. Moreover, any automated tool that analyzes or depends on the circuit connectivity to analyze the circuit design will be unable to operate properly if the layout and netlist are not modified to be consistent with each other at the step 170.

From the foregoing description, it should be understood that a design for an access cell and a method for enabling automatic insertion of access cells have been shown and described, which have many desirable attributes and advantages. The access cell design includes a pathway configuration that allows spacing requirements to be met without adversely impacting the overall dimensions of the access cell. The method for enabling automatic insertion of access cells is less costly because it is automated and is more effective because the method may be used to ensure that the access cells are located in a manner that enables use of the access cells for testing purposes. Moreover, the method for inserting the test cells is compatible with existing design processes that use a computerized layout tool such as a "place and route" tool.

While various embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

For example, although the automated tool used to modify the netlist may be implemented using any of a number of well known random generation algorithms including a weighted averages technique. Further, the automated tool, although described as having a keyboard, monitor and mouse, may also include any number of peripherals configured in a variety of ways. In addition, the steps for performing a method for enabling automatic insertion of access cells and the steps performed by the automated tool are intended to be illustrative only and, thus, may include any number of steps for performing the methods in any manner in accordance with the present invention. In addition, the order in which the steps are performed may be altered. For example, the step 140 at which the library data is modified may be performed at any point in the method provided that it is performed before the place and route tool creates the layout at the step 150. Moreover, the method may be performed iteratively until a desired layout configuration has been obtained. If performed iteratively however, the step 140 at which the cell library description is modified is not performed in subsequent iterations of the method but is instead only performed once.

Various features of the invention are set forth in the appended claims.

What is claimed is:

1. A method for reconfiguring a current pathway disposed in an access cell, wherein said current pathway comprises a first current path coupled to a second current path via a third current path, said first, second and third current paths being disposed lengthwise in said access cell, wherein said third current path includes a first leg disposed between said first and said second current paths, a second leg connecting said first current path to said first leg, and a third leg connecting said second current path to said first leg, and further wherein said current pathway enables current flow between a first net coupled to said first current pathway and a second net coupled to said second current pathway, said method comprising the steps of:

severing said first leg of said third current path to interrupt said current flow from said first net to said second net; and, connecting a third net to said first leg of said third current path at a location on said first leg that allows current to flow between said third net and said second net.

2. A method for reconfiguring a current pathway disposed in an access cell, wherein said current pathway comprises a first current path coupled to a second current path via a third current path, said first, second and third current paths being disposed lengthwise in said access cell, wherein said third current path includes a first leg disposed between said first and said second current paths, a second leg connecting said first current path to said first leg, and a third leg connecting said first leg to said second current path, and further wherein said current pathway enables current flow between a first net coupled to said first current pathway and a second net coupled to said second current pathway, said method comprising the steps of:

severing said first leg of said third current path to interrupt said current flow from said first net to said second net; and, connecting a third net to said first leg of said third current path at a location on said third net that allows current to flow between said third net and said first net.

3. A method for enabling the automatic insertion of an access cell into an integrated circuit design, said method comprising the steps of:

modifying a standard definition of said access cell stored in a cell library;

identifying a net to which said access cell shall be coupled;

modifying a netlist so that said net is represented in said netlist as two virtual nets;

adding an access cell to said netlist; and, defining said access cell as being coupled between said two virtual nets.

4. The method of claim 3 wherein said step of modifying said netlist comprises the steps of identifying a logic cell that is coupled to said net, and modifying data associated with said logic cell.

5. The method of claim 4 wherein said data associated with said logic cell comprises a name of said net, and wherein said step of modifying said data associated with said logic cell further comprises changing said name.

6. The method of claim 3 wherein said step of modifying a standard definition of said access cell stored in a cell library comprises the step of modifying said definition to indicate that said access cell has two terminals.

7. The method of claim 3 further comprising the step of creating a layout of said integrated circuit using a place and route tool, said place and route tool being adapted to use said netlist and said cell library to create said layout, wherein said place and route tool causes said access cell to be inserted into said layout such that said net is routed through said access cell.

8. The method of claim 7 further comprising the steps of:
   modifying said netlist after said layout has been created so that said virtual nets are represented in said netlist as said net; and,
   modifying said layout so that said virtual nets are represented in said layout as said net.

9. The method of claim 3 wherein said steps of identifying a net, causing said net to be represented as two virtual nets, adding an access cell and defining said access cell as being coupled between said two virtual nets is preformed using an automated tool.

10. A method for enabling the automatic insertion of access cells into an integrated circuit design, said method comprising the steps of:
   modifying a standard definition of said access cells stored in a cell library to specify that said access cells have two terminals; and,
   modifying a netlist to include said access cells.

11. The method of claim 10 wherein said step of modifying said netlist comprises the steps of:
   identifying a set of nets in said netlist to which said access cells shall be coupled;
   identifying a set of cells in said netlist, each cell being coupled to at least one of said nets;
   modifying data associated with at least some of said cells to indicate that at least some said cells are coupled to one of a set of virtual nets instead of one of said nets; and,
   adding a set of access cells to the netlist, wherein said access cells are identified as being coupled between one of said nets and one of said virtual nets.

12. The method of claim 10 further comprising the step of creating a layout of said integrated circuit using a place and route tool, said place and route tool being adapted to use said modified netlist and said modified cell library to create said layout, wherein said place and route tool causes said access cells to be inserted into said layout such that said net is routed through said access cell.

13. The method of claim 12 further comprising the steps of:
   modifying said modified netlist after said layout has been created so that said virtual nets are represented in said netlist as said nets; and,
   modifying said layout so that said virtual nets are represented in said layout as said nets.

14. A computer program product comprising a computer usable medium having computer readable program code embodied in said medium that, when executed, causes a computer to:
   receive a list that identifies a set of nets to which a set of access cells shall be coupled, wherein each of said nets appearing on said list is represented in said netlist as a single net;
   modify a netlist so that each of said nets stored in said list is represented in said netlist as a pair of unique nets; and,
   modify said netlist to include a set of access cells, wherein each of said access cells is defined as being connected between one of said pairs of nets.

15. The computer program product of claim 14 wherein said nets identified in said list have been entered by a user.

16. The computer program product of claim 14 wherein said nets identified in said list have been generated by an algorithm that causes nets to be randomly selected from said netlist.

17. The computer program product of claim 14 wherein said computer readable program code, when executed, further causes said computer to:
   modify said netlist so that said pairs of unique nets are represented in said netlist as said single nets; and,
   modify said layout so that said pairs of unique nets are represented in said layout as said single nets.

18. A computer program product comprising a computer usable medium having computer readable program code embodied in the medium that, when executed, causes a computer to:
   identify a set of nets to which a set of access cells shall be coupled, wherein each of said nets appearing on said list is represented in a netlist as a single net;
   modify said netlist so that each of said nets stored in said list is represented in said netlist as a pair of unique nets; and,
   modify said netlist to include a set of access cells, wherein each of said access cells is defined as being connected between one of said pairs of unique nets.

19. The computer program product of claim 18 wherein said computer readable program code, when executed, further causes said computer to:
   determine whether each net listed in said netlist has been included in a first list of nets, wherein said first list comprises nets to which access cells shall be coupled;
   add said net to said set of identified nets if said net is included in said first list;
   determine whether said net has been included in a second list of nets if said net is not included in said first list, wherein said second list comprises nets to which said access cells shall not be coupled;
   not add said net to said set of identified nets if said net is included in said second list;
   determine whether said net is subject to any of a set of constraints if said net has not been included in said second list of nets;
   not add said net to said set of identified nets if said net is subject to any of said constraints;
   determine whether said net should be added to said set of identified nets using an algorithm if said net is not subject to any of said constraints; and,
   add said net to said set of identified nets if, according to said algorithm, said net should be added to said identified nets.

20. The computer program product of claim 18 wherein said computer readable program code, when executed, further causes said computer to:
   execute an algorithm that causes said nets to be identified in a random fashion until a predetermined percentage of all nets listed in said netlist have been added to said set of identified nets.

21. The computer program product of claim 18 wherein said computer readable program code, when executed, further causes said computer to:
   access a user-generated file; and,
   identify said set of nets by comparing said user-generated file to each of said nets in said netlist.

22. The computer program product of claim 21 wherein said nets included in said user-generated file are associated with a portion of the integrated circuit logic that is at risk for design defects.

23. The computer program product of claim 18 wherein said computer readable program code, when executed, further causes said computer to:

identify said set of nets by comparing each of said nets in said netlist to a set of constraints.

24. The computer program product of claim 23 wherein one of said constraints is that said net is coupled to a driving cell.

25. The computer program product to claim 23 wherein one of said constraints is that said net is a clock net.

26. The computer program product of claim 23 wherein one of said constraints is that said net is a test net.

* * * * *